United States Patent
Escusa et al.

(10) Patent No.: US 10,832,927 B2
(45) Date of Patent: Nov. 10, 2020

(54) INTERLOCKING NEST WAFER PROTECTOR

(71) Applicant: Texas Instruments Incorporated, Dallas, TX (US)

(72) Inventors: Albert Winston Dulay Escusa, Garland, TX (US); William Casuga Nisperos, Garland, TX (US); Lorence S. Pareja, Garland, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/974,166

(22) Filed: Dec. 18, 2015

(65) Prior Publication Data
US 2017/0178937 A1 Jun. 22, 2017

(51) Int. Cl.
*H01L 21/673* (2006.01)

(52) U.S. Cl.
CPC .. *H01L 21/67383* (2013.01); *H01L 21/67346* (2013.01); *H01L 21/67369* (2013.01); *H01L 21/67373* (2013.01); *H01L 21/67386* (2013.01)

(58) Field of Classification Search
CPC ......... H01L 21/67383; H01L 21/67346; H01L 21/67386; H01L 21/67373; H01L 21/673; H01L 21/67369; H01L 21/67366; B65D 90/52
USPC ....... 206/710, 701, 711, 712, 722, 723, 724, 206/499, 503, 509, 449, 455, 453; 211/41.1, 41.12, 41.13, 41.17, 41.18
See application file for complete search history.

(56) References Cited

U.S. PATENT DOCUMENTS

| | | | | |
|---|---|---|---|---|
| 6,550,619 B2* | 4/2003 | Bores | ................ | H01L 21/67369 206/303 |
| 6,926,150 B2* | 8/2005 | Amador | ............ | H01L 21/67366 206/303 |
| 7,138,726 B2* | 11/2006 | Amador | ............ | H01L 21/67366 257/798 |
| 7,530,462 B2* | 5/2009 | Yajima | .............. | H01L 21/67346 206/303 |
| 8,756,799 B2* | 6/2014 | Yoshizawa | .......... | H01L 21/6734 29/739 |
| 8,844,719 B2* | 9/2014 | Yoshida | ................. | B65D 57/00 206/453 |
| 9,644,894 B2* | 5/2017 | Torimi | .................. | F27D 5/0037 |
| 2005/0072121 A1* | 4/2005 | Hortzleza | ......... | H01L 21/67369 53/447 |

(Continued)

FOREIGN PATENT DOCUMENTS

| | | |
|---|---|---|
| CN | 101048852 A | 10/2007 |
| CN | 101114603 A | 1/2008 |

(Continued)

*Primary Examiner* — Jacob K Ackun
*Assistant Examiner* — Jenine Pagan
(74) *Attorney, Agent, or Firm* — Jacqueline J. Garner; Charles A. Brill; Frank D. Cimino

(57) ABSTRACT

An interlocking ring wafer separator for reducing particles during shipment of integrated circuit wafers has a wafer shelf, an interlocking tab which prevents the edge of the wafer from coming into contact with the inner wall of the wafer shipping container, and an interlocking slot into which the interlocking tab of a second interlocking ring wafer separator may be inserted locking the two interlocking ring wafer separators together in the coin stacked wafers.

15 Claims, 4 Drawing Sheets

(56) References Cited

U.S. PATENT DOCUMENTS

| | | | | |
|---|---|---|---|---|
| 2009/0196714 A1* | 8/2009 | Sylvestre | .......... | H01L 21/67383 |
| | | | | 414/217.1 |
| 2009/0250374 A1* | 10/2009 | Kasama | ............ | H01L 21/67383 |
| | | | | 206/711 |
| 2010/0224517 A1* | 9/2010 | Haggard | ........... | H01L 21/67369 |
| | | | | 206/308.1 |
| 2014/0076774 A1* | 3/2014 | Kaashoek | ......... | H01L 21/67379 |
| | | | | 206/711 |
| 2015/0249025 A1* | 9/2015 | Torimi | .................. | F27D 5/0037 |
| | | | | 432/198 |
| 2017/0330778 A1* | 11/2017 | Nishijima | ......... | H01L 21/67369 |

FOREIGN PATENT DOCUMENTS

| WO | WO-2007092557 A2 * | 8/2007 | ....... H01L 21/67346 |
|---|---|---|---|
| WO | 2015130690 A1 | 9/2015 | |

\* cited by examiner

INTERLOCKING NEST WAFER PROTECTOR

FIELD OF THE INVENTION

This invention generally relates to wafer carriers or packages used for shipping semiconductor wafers. More particularly, this invention relates to a protective ring separator for use between coin-stacked wafers during the shipping of wafers in a wafer shipping container.

BACKGROUND

Some manufacturers of integrated circuits produce semiconductor wafers at one location and ship the wafers for dicing and packaging at a different location. In such cases, the wafers are typically shipped in a container referred to as a coin-stack shipping container in which the wafers are stacked one on top of another. To prevent damage during shipment, a protective ring separator is placed between each wafer. The protective ring separators prevent one wafer from rubbing against another during shipment. The protective ring separator 100 (FIG. 1A) is a ring that is open in the center.

Such a coin-stack shipping container 200 is illustrated in FIG. 2A. The wafers 204 are stacked in the coin-stack shipping container 200 with a protective ring separator 100 between each wafer 204.

A plan view of a typical protective ring separator 100 is illustrated in FIG. 1A. The circumference of the protective ring separator 100 is slightly smaller than the inside circumference of the wafer shipping container 200 (FIG. 2A) so that it fits comfortably inside the shipping container while providing little room for movement during shipping.

A magnified cross sectional view 108 of the protective ring separator 100 is shown in FIG. 1B. This magnified view 108 is taken along cut line 106 of the inset 104 in FIG. 1A. The protective ring separator 108 is typically L-shaped wherein the spine of the L faces the inner surface of the wafer shipping container 200 and the foot 111 of the L extends inward toward the center of the wafer shipping container 200. The wafer sits face down on the top of the L (also called a wafer shelf 112). The wafer shelf 112 is sufficiently higher than the foot 111 on the protective ring separator 100 to enable the wafers 204 and the ring separators 108 to be loaded and unloaded automatically from the wafer shipping container 200.

As shown in FIG. 2A wafers 204 are coin-stacked in the wafer shipping container 200 with a ring separator 108 between each wafer 204.

As shown in FIG. 2B, each wafer 204 is loaded face down on the wafer shelf 112 of the ring separator 108 and coin-stacked on the wafer 204 below it. The ring separators 108 prevent the front surface of one wafer 204 which contains the integrated circuits from rubbing against the backside of the wafer 204 below it in the coin-stack causing damage to the integrated circuits during shipment.

SUMMARY

An interlocking ring wafer separator for reducing particles during shipment of integrated circuit wafers has a wafer shelf, an interlocking tab which prevents the edge of the wafer from coming into contact with the inner wall of the wafer shipping container, and an interlocking slot into which the interlocking tab of a second interlocking ring wafer separator may be inserted locking the two interlocking ring wafer separators together in the coin stacked wafers.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 3A:
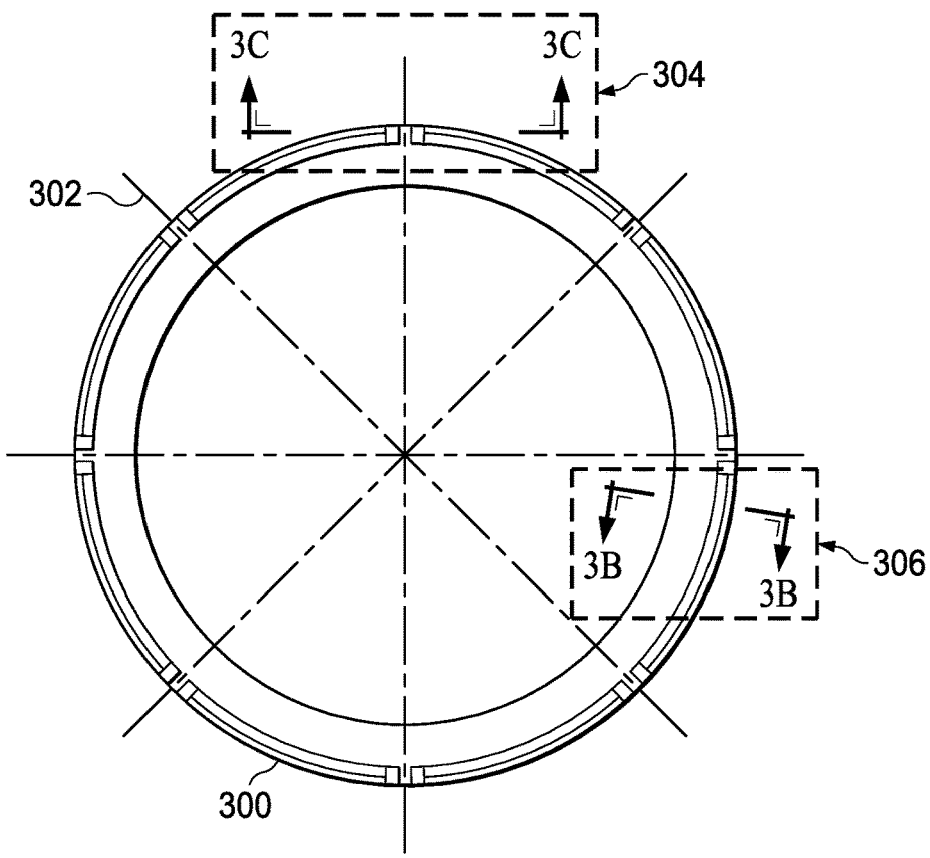
FIG. 3A is a plan view of an interlocking ring wafer separator formed according to embodiments of the invention.
Figure 3B:
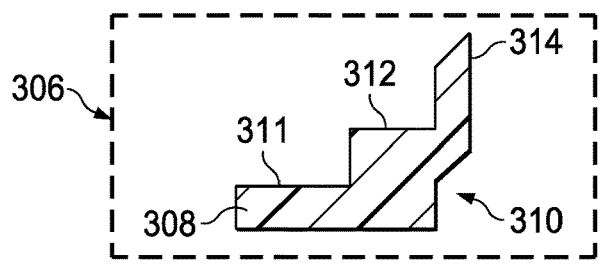
FIG. 3B is a cross-section of a surface tension release slot in an interlocking ring wafer separator formed according to embodiments of the invention.
Figure 3C:
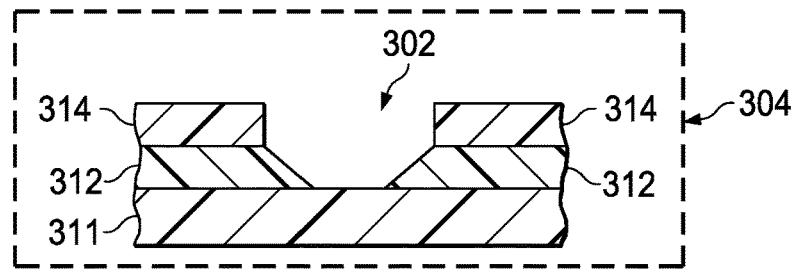
FIG. 3C is a cross-section of an interlocking ring wafer separator formed according to embodiments of the invention.

An interlocking ring separator 300 is illustrated in a plan view in FIG. 3A and cross sectional views in FIGS. 3B and 3C. The interlocking ring separator 300 features an interlocking tab 314 (FIG. 3B) that extends around the outside circumference of the upper outer edge of the interlocking ring separator 300 and an interlocking slot 310 that extends around the outside circumference of the lower outer edge of the interlocking ring separator 300. Surface tension release slots 302 are formed at various locations around the interlocking ring separator 300 to prevent the interlocking ring separator from sticking to a wafer 400 when it is removed from the shipping container.

Figure 4A:
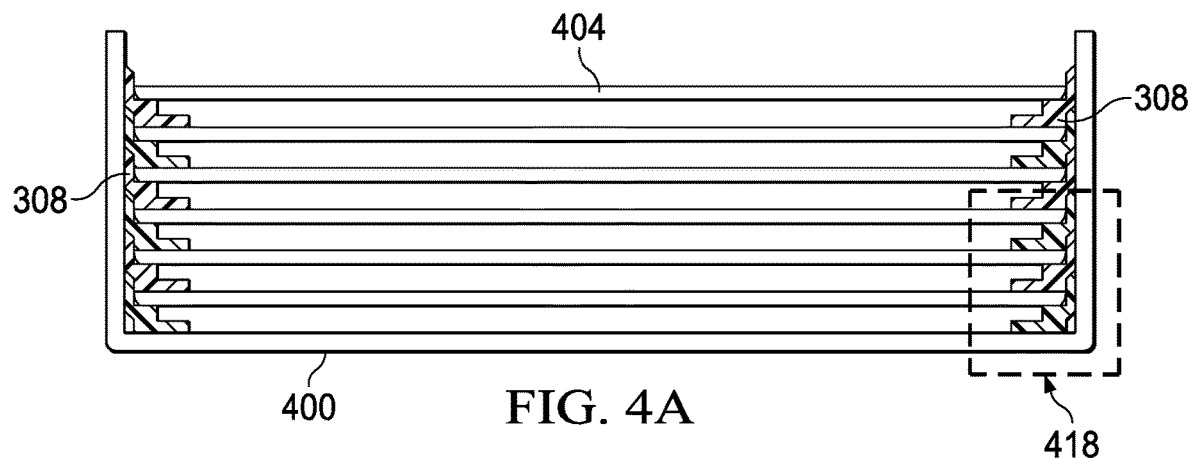
FIGS. 4A and 4B are cross sections of coin stacked integrated circuit wafers and interlocking ring wafer separators formed according to embodiments of the invention in a wafer shipping container
Figure 4B:
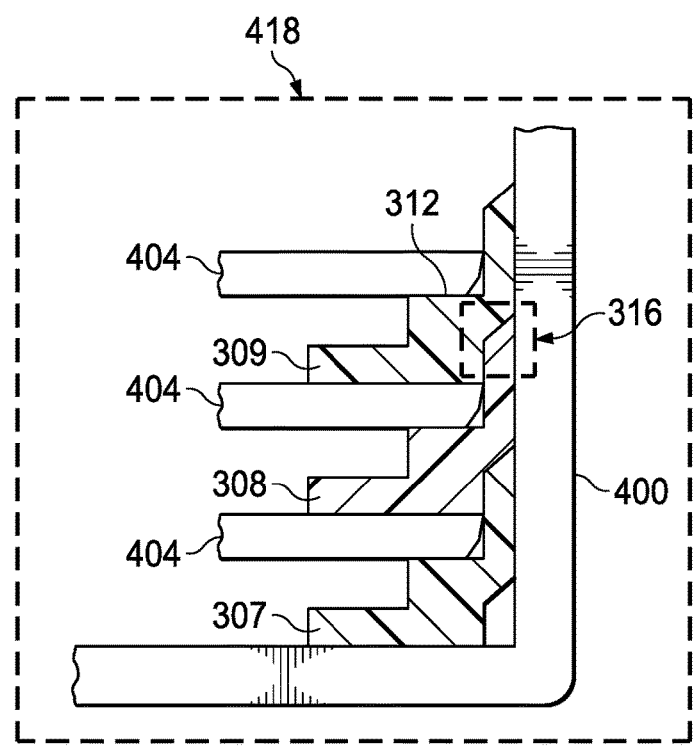

As shown in FIG. 3B, the interlocking tab 314 surrounds the wafer shelf 312 and lies between the edge of the wafer 404 (FIG. 4A) and the inner wall of the wafer shipping container 400. The inner diameter of the interlocking tab 314 is slightly larger than the diameter of a wafer 404. The interlocking tab 314 has an angled/slanted top surface that extends from the outermost edge of the interlocking ring separator 300 and forms an acute angle with the outermost edge. The wafer 404 is placed face down on the wafer shelf 312 during shipment (FIG. 4B). The interlocking tab 314 prevents the edge of the wafer 404 from coming into contact with the walls of the shipping container 400 and generating particles by abrading the walls. The interlocking tab 314 extends above the wafer shelf 312 a sufficient height to be inserted into an interlocking slot 310 on an overlying interlocking ring separator 300 when a wafer is present on the wafer shelf 312. This locks the two interlocking ring separators together further reducing the relative motion of wafers during shipment and additionally reducing particle formation.

The interlocking slot 310 extends around the lower outer circumference of the ring separator 300 and lies directly below the interlocking tab 314. As shown in FIG. 3B, the interlocking slot 310 has an angled or slanted surface that extends from the outermost edge of the interlocking ring separator 300. The width of the interlocking slot 310 is slightly larger than the width of the interlocking tab 314 so that the interlocking tab 314 fits into the interlocking slot 310 without binding. The interlocking tab 314 from a lower interlocking ring separator 308, fits into the interlocking slot 310 of an upper interlocking ring separator 309. As shown in the inset 418 in FIG. 4B, this locks the coin stack of wafers 404 together preventing independent motion of one wafer 404 with respect to another wafer 404. The reduction of independent motion of the wafers 404 and the prevention of the wafer 404 edges from coming into contact with the inside walls of the wafer box 400 significantly reduces particle generation during the shipping of the wafers 404. The wafer 404 lies face down on a wafer shelf 312. The width of the wafer shelf 312 typically is about the size of the outer exclusion zone of processed wafers 404 so it does not come into contact with and damage active die. Typically this width is about 3 mm or less.

The foot 311 extends around the bottom inner circumference of the interlocking ring separator 300. The foot enables automatic loading and unloading of the wafers 404 and the automatic loading and unloading of the interlocking ring wafer separators 300 from the wafer shipping container 400. The width of the foot may depend upon the requirements of the automatic pick-and-place loader and unloader.

The wafer shelf 312 (FIG. 3B) is formed a sufficient height above the foot 311 to enable a pick-and-place machine to automatically load and unload wafers and to automatically load and unload the interlocking ring separators 300 from the wafer shipping container 400. The height of the wafer shelf 312 above the foot 311 is also sufficient to prevent structures such as ball bonds which may be formed on the top side of the upper wafer 404 from coming into contact with the backside of the underlying wafer 404. The height of the wafer shelf 312 above the foot 311 may depend upon the height features on the surface of the wafer and may depend upon requirements of the pick-and-place machine.

FIG. 3C shows a cross section of one of the surface tension release slots 302 in the interlocking ring separator 300. The surface tension release slots allow air to enter between the wafer 404 (FIG. 4B) and the wafer shelf 312 when the wafer is being removed from the wafer shipping container 400. This prevents other wafers 404 with air trapped below them in the wafer shipping container 400 from moving when the top wafer 404 is removed. In the surface tension release slot 302 depicted in the cross section 304 in FIG. 3C a notch is formed in the interlocking tab 314 and also formed in the wafer shelf 312 at various points around the circumference of the interlocking ring separator 300. Typically between 4 and 8 surface tension release slots 302 are formed in the interlocking ring separator 300. The dimension of the surface tension release slot is typically between about 1 to 3 mm but may be wider. The surface tension release slot 302 design in FIG. 3C illustrates an example implementation. Other surface tension release slot 302 designs are also possible.

The interlocking ring separator 300 may have a variety of designs. The design in FIGS. 3 and 4 illustrate the concept and are not intended to be limiting in any way. As may be appreciated by those skilled in the art other interlocking tab and slot designs are possible for locking the wafer coin stack together in a way that prevents independent motion of the wafers, prevents the edge of wafers from abrading the inside walls of the wafer shipping container 400, and also enables automatic pick-and-place loading and unloading of wafers and the interlocking ring separators into and out of the wafer shipping container 400.

Figure 1A:
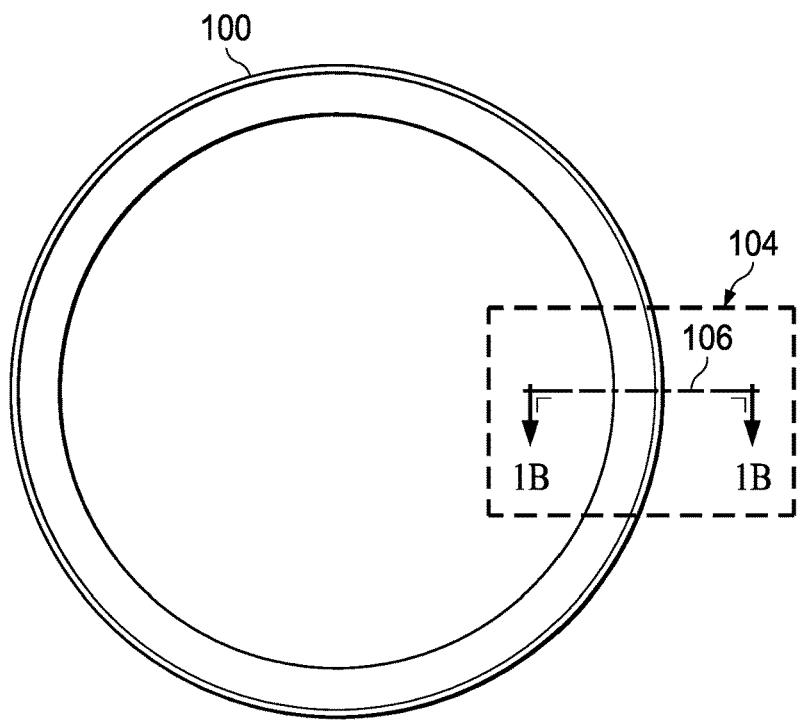
FIG. 1A is a plan view and 1B is a cross-section (Prior art) of a typical ring wafer separator that is used for shipping integrated circuit wafers.
Figure 1B:
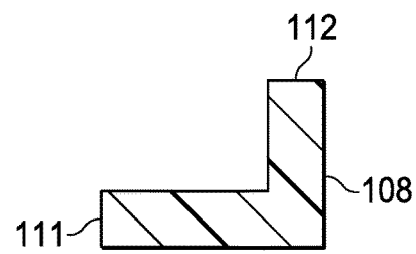
Figure 5:
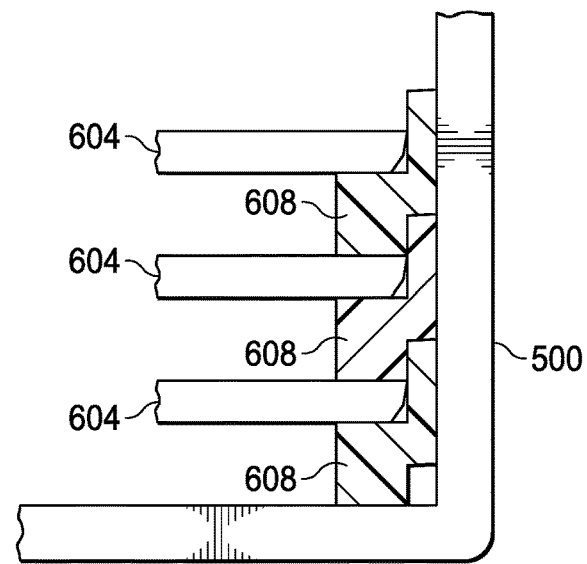
FIG. 5 is a cross section of coin stacked integrated circuit wafers with interlocking ring wafer separators formed according to embodiments of the invention in a wafer shipping container
Figure 2A:
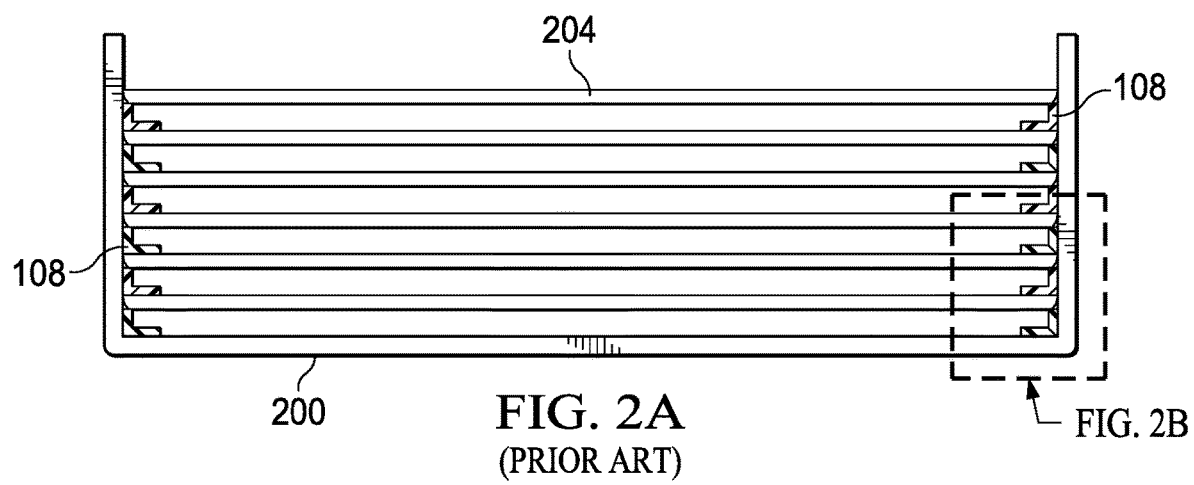
FIGS. 2A and 2B (Prior art) are cross sections of coin stacked integrated circuit wafers and ring wafer separators in a wafer shipping container
Figure 2B:
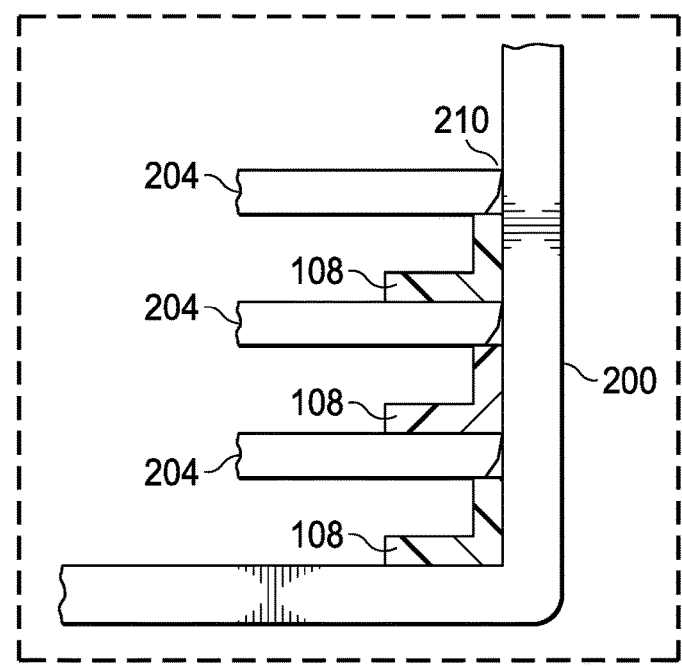

An alternative design for an interlocking ring separator 608 formed according to embodiments is illustrated in FIG. 5. Wafers 604 are supported in a coin-stack by interlocking ring separators 608 and placed in a wafer shipping container 600. This interlocking ring separator 608 is similar to the interlocking ring separator 308 in FIG. 4B but designed without a foot 311. This interlocking ring separator 608 may require a vacuum ring pick-and-place machine to accommodate the design without a foot 311.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An interlocking ring wafer separator for shipping integrated circuit wafers in a wafer shipping container, comprising:
   a wafer shelf that is ring-shaped;
   an interlocking tab wherein the interlocking tab extends around an outer circumference of the wafer shelf, wherein the interlocking tab extends above the wafer shelf and has a top surface that is slanted from an outermost perimeter surface of the interlocking ring wafer separator; and
   an outer edge that is indented from the outermost perimeter surface a first distance in a radial direction toward a center of the interlocking ring wafer separator, and has an angled surface that is slanted from the outermost perimeter surface, the outer surface creating an interlocking slot which extends around a bottom outer circumference of the interlocking ring wafer separator wherein the first distance is slightly larger than a width of the interlocking tab and wherein the interlocking slot is located directly below the interlocking tab.

2. The interlocking ring wafer separator of claim 1, wherein a width of the wafer shelf is less than about 3 mm.

3. The interlocking ring wafer separator of claim 1 further comprising a foot wherein the foot extends around an inner bottom circumference of the interlocking ring wafer separator and wherein the foot extends inward toward a center of the interlocking ring wafer separator and wherein a top surface of the wafer shelf is sufficiently above the foot to allow an automatic pick-and-place loader and unloader to load and unload the wafer and the interlocking ring wafer separator.

4. The interlocking ring wafer separator of claim 1 further comprising surface tension release slots located at intervals around a circumference of the interlocking ring wafer separator.

5. The interlocking ring wafer separator of claim 4, wherein a width of each surface tension release slot is between 1 mm and 3 mm.

6. The interlocking ring wafer separator of claim 4, wherein there are between 4 and 10 surface tension release slots.

7. The interlocking ring wafer separator of claim 4, wherein each surface tension release slot comprises a gap in the circumference of the interlocking tab and comprises a gap in the circumference of the wafer shelf.

8. A shipping container, comprising
a sidewall; and
a stack of interlocking ring wafer separators, wherein each interlocking ring wafer separator comprises:
a wafer shelf that is ring-shaped;
an interlocking tab wherein the interlocking tab extends around an outer circumference of the wafer shelf between the wafer shelf and the sidewall of the shipping container, wherein the interlocking tab extends above the wafer shelf a distance greater than a wafer height and has a top angled surface that forms an acute angle with an outermost perimeter surface of the interlocking ring wafer separator and wherein the top angled surface extends from the outermost perimeter surface; and
an interlocking slot which extends around a bottom outer circumference of the interlocking ring wafer separator wherein the interlocking slot is located directly below the interlocking tab and includes an angled surface extending from the outermost perimeter surface;
wherein the interlocking tab of an upper interlocking ring wafer separator in the stack of interlocking ring wafer separators extends into the interlocking slot of a lower interlocking ring separator in the stack of interlocking ring wafer separators.

9. The shipping container of claim 8, wherein a width of the wafer shelf is less than about 3 mm.

10. The shipping container of claim 8, further comprising a foot wherein the foot extends around an inner bottom circumference of the interlocking ring wafer separator and wherein the foot extends inward toward a center of the interlocking ring wafer separator and wherein a top surface of the wafer shelf is sufficiently above the foot to allow an automatic pick-and-place loader and unloader to load and unload the wafer and the interlocking ring wafer separator.

11. The shipping container of claim 8, further comprising surface tension release slots located at intervals around a circumference of the interlocking ring wafer separator.

12. The shipping container of claim 11, wherein a width of each surface tension release slot is between 1 mm and 3 mm.

13. The shipping container of claim 11, wherein there are between 4 and 10 surface tension release slots.

14. The shipping container of claim 11, wherein each surface tension release slot comprises a gap in the circumference of the interlocking tab and comprises a gap in the circumference of the wafer shelf.

15. A shipping container, comprising
a sidewall; and
a stack of interlocking ring wafer separators, wherein each interlocking ring wafer separator comprises:
a wafer shelf that is ring-shaped;
an interlocking tab wherein the interlocking tab extends around an outer circumference of the wafer shelf between the wafer shelf and the sidewall of the shipping container, wherein the interlocking tab extends above the wafer shelf and has a top surface that forms an acute angle with, and extends from, an outermost perimeter surface of the interlocking ring wafer separator;
a foot wherein the foot extends around an inner bottom circumference of the interlocking ring wafer separator and wherein the foot extends inward toward a center of the interlocking ring wafer separator and wherein a top surface of the wafer shelf is sufficiently above the foot to allow an automatic pick-and-place loader and unloader to load and unload the wafer and the interlocking ring wafer separator;
an outer edge that is indented from the outermost perimeter surface a first distance in a radial direction toward a center of the interlocking ring wafer separator, and an angled surface connects the outermost perimeter surface to the outer edge, the angled surface extending from the outermost perimeter surface, to create an interlocking slot which extends around a bottom outer circumference of the interlocking ring wafer separator, the interlocking slot located between the foot and the sidewall, wherein the interlocking slot is located directly below the interlocking tab; and
surface tension release slots located at intervals around a circumference of the interlocking ring wafer separator, wherein each surface tension release slot comprises a gap in the circumference of the interlocking tab and comprises a gap in the circumference of the wafer shelf;
wherein the interlocking tab of an upper interlocking ring wafer separator in the stack of interlocking ring wafer separators extends into the interlocking slot of a lower interlocking ring separator in the stack of interlocking ring wafer separators.

\* \* \* \* \*